(12) United States Patent
Lin

(10) Patent No.: US 8,552,797 B2
(45) Date of Patent: Oct. 8, 2013

(54) HIGH ACCURACY RC CALIBRADION CIRCUIT

(75) Inventor: Charles Guo Lin, Austin, TX (US)

(73) Assignee: ST-Ericsson SA, Plan-les-Ouates (CH)

( * ) Notice: Subject to any disclaimer, the term of this patent is extended or adjusted under 35 U.S.C. 154(b) by 0 days.

(21) Appl. No.: 13/333,059

(22) Filed: Dec. 21, 2011

(65) Prior Publication Data
US 2013/0033307 A1  Feb. 7, 2013

Related U.S. Application Data

(60) Provisional application No. 61/515,181, filed on Aug. 4, 2011.

(51) Int. Cl.
*H03K 5/00* (2006.01)
(52) U.S. Cl.
USPC .......................................... 327/553; 327/552
(58) Field of Classification Search
USPC ................................................. 327/551–559
See application file for complete search history.

(56) References Cited

U.S. PATENT DOCUMENTS

| 5,113,090 | A | 5/1992 | Imaizumi et al. |
| 5,585,765 | A | 12/1996 | O'Shaughnessy |
| 6,417,737 | B1 | 7/2002 | Moloudi et al. |
| 6,803,813 | B1 * | 10/2004 | Pham ............................ 327/553 |
| 7,078,961 | B2 * | 7/2006 | Punzenberger et al. ...... 327/553 |
| 7,208,980 | B2 | 4/2007 | Mulder |
| 7,477,098 | B2 * | 1/2009 | Dharmalinggam et al. .. 327/553 |
| 7,986,181 | B2 * | 7/2011 | Confalonieri et al. ........ 327/553 |
| 2009/0051401 | A1 | 2/2009 | Confalonieri et al. |

FOREIGN PATENT DOCUMENTS

JP           62112419           11/1985

* cited by examiner

*Primary Examiner* — Dinh T. Le
(74) *Attorney, Agent, or Firm* — Coats & Bennett, P.L.L.C.

(57) ABSTRACT

In an RC calibration circuit, a single reference current is used to generate voltages across both a resistive and capacitive element. The component value of one of the resistive and capacitive element is successively altered until the voltages are substantially equal. Additionally, parasitic capacitances in the circuit are precharged to the resistive element voltage prior to the comparison. The RC calibration circuit eliminates the errors due to current matching and parasitic capacitances in prior art calibration circuits. The circuit includes a comparator and a digital control circuit (DCW) including a successive approximation register (SAR) holding the value of the digital control word used to control the component value of the tunable resistive or capacitive element. The SAR alters the DCW in an iterative, bit-by-bit binary searching pattern in response to the comparator output.

19 Claims, 11 Drawing Sheets

HIGH ACCURACY RC CALIBRADION CIRCUIT

PRIORITY CLAIM

The present application claims priority to U.S. Application No. 61/515,181, titled "High Accuracy RC Calibration Circuit", filed with the U.S. Patent Office on Aug. 4, 2011, the disclosure of which is incorporated herein by reference in its entirety.

TECHNICAL FIELD

The present invention relates generally to electronic circuits, and in particular to an improved RC calibration circuit.

BACKGROUND

In modern IC design, and in particular in the field of portable wireless transceivers, a very high degree of integration, with minimum external components, is mandatory for cost reduction. In current semiconductor process, without an expensive trimming process, the component values of raw passive resistive (R) and capacitive (C) devices can vary over a wide range. Temperature variation can also cause on-chip RC values to change. Such wide RC variation makes the design of a continuous time RC filter, with stable corner frequency, challenging. One known solution is to embed an automatic calibration mechanism within the chip to maintain the RC product constant.

FIG. 1 depicts a functional circuit diagram of conventional RC calibration circuit 10, the purpose of which is to calibrate the R or C value in another circuit, such as a slave filter 28. The filter 28 may be used, for example, in a frequency-conversion mixer or the like. The circuit 10 accomplishes this by calibrating the values of a corresponding resistor $R_{REF}$ or capacitor $C_C$, and setting the R or C element in the slave filter 28 to the same value (FIG. 1 depicts adjustment of $C_C$). A current mirror 12 generates two current sources supplying currents $I_{REF1}$ and $I_{REF2}$ into a resistor $R_{REF}$ and a capacitor $C_C$, respectively, to generate $V_R$ and $V_C$. In the resistor branch, the constant current flows into the resistor $R_{REF}$ to generate $V_R = I_{REF1} * R_{REF}$. In the capacitor branch, the current will be integrated on the capacitor $C_C$ for a fixed period of time $T_{TAR}$. If the capacitor $C_C$ initial voltage equals zero, at the end of current integration, $V_C = I_{REF2} * T_{TAR} / C_C$. $T_{TAR}$ is the target time constant, in general generated by a crystal oscillator (not shown), which can have high accuracy, with frequency errors well below 1%.

A comparator 14 and sequential approximation register (SAR) 16 are the basis of a digital calibration circuit 10 using a binary searching algorithm to minimize the difference $V_{RC}$ $V_R - V_C$. The searching process minimizes $V_{RC}$ at the input of the comparator 14 by properly tuning the value of R or C. At the end of the searching processing, $V_R = V_C$ or equivalently $I_{REF1} * R_{REF} = I_{REF2} * T_{TAR} / C_C$. If $I_{REF1} = I_{REF2}$, the reference current can be cancelled out and the proper calibration $T_{TAR} = R_{REF} * C_C$ is achieved. The final digital control word (DCW) code output by the SAR 16 is distributed to the slave filter 18. By periodically recalibrating the circuit 10 and adjusting the value of R or C in the slave filter 18, the filter 18 is tuned to have a time constant independent of process and temperature variation.

One problem with a conventional RC calibration circuit 10, such as that of FIG. 1, is that it requires $I_{REF1}$ to match to $I_{REF2}$. Any mismatch between $I_{REF1}$ and $I_{REF2}$ will result in an RC time constant calibration error. In order to improve the current source matching performance, the current source device size must increase. The problem with increasing the device size is that the parasitic capacitance $C_{PM}$ associated with current source output node will increase with the device size. Any extra capacitance added to the current source output node will result in an RC time constant calibration error, because the charge delivered by the current source will be shared by $C_C$ and $C_{PM}$. Accordingly, the conventional RC time constant calibration circuit 10, such as that of FIG. 1, cannot be optimized to achieve high calibration accuracy, even if the circuit layout size is not restricted.

Another problem with the conventional RC calibration circuit 10 is that any parasitic capacitance present in the branch between the current source transistor and $C_C$, e.g., the parasitic capacitance from the input of comparator $C_P$, will result in calibration error, since the total charge sourced from the current source is shared by $C_C$ and the parasitic capacitance.

SUMMARY

According to one or more embodiments described and claimed herein, a current steering architecture eliminates the current source matching requirement. Compared with a conventional RC calibration circuit, embodiments of the present invention generate $V_R$ and $V_C$ from the same reference current. Accordingly, current matching performance is guaranteed by the architecture.

Embodiments of the present invention also pre-charge the parasitic capacitance to $I_{REF} * R_{REF}$ (the resistor voltage). This process cancels out the parasitic capacitance, which eliminates the accuracy loss related to the parasitic capacitance of the current source output $C_{PM}$ and the capacitive loading from the input loading of comparator $C_P$.

One embodiment relates to an RC calibration circuit. The circuit includes a resistive element and a capacitive element, where at least one of the resistive and capacitive elements is tunable. The circuit also includes a current source providing a single reference current selectively through the resistive or capacitive elements. The circuit further includes a comparator for determining a voltage difference by comparing the voltage drops across the resistive and capacitive elements, and a control circuit. The control circuit is operative to tune at least one of the resistive and capacitive elements so as to minimize the voltage difference determined by the comparator.

Another embodiment relates to a method of tuning the component value of one of a resistive and capacitive element in an RC calibration circuit so as to equalize the voltage drops across the resistive and capacitive elements. A single reference current is provided. The reference current is directed through the capacitive element for a predetermined duration to charge the capacitive element to a first voltage. The reference current is directed through the resistive element to generate a second voltage. The first and second voltages are compared. The component value of one of the resistive and capacitive elements is altered in response to the comparison. This process is repeated with different component values until the first and second voltages are substantially equal.

DETAILED DESCRIPTION

Figure 2:
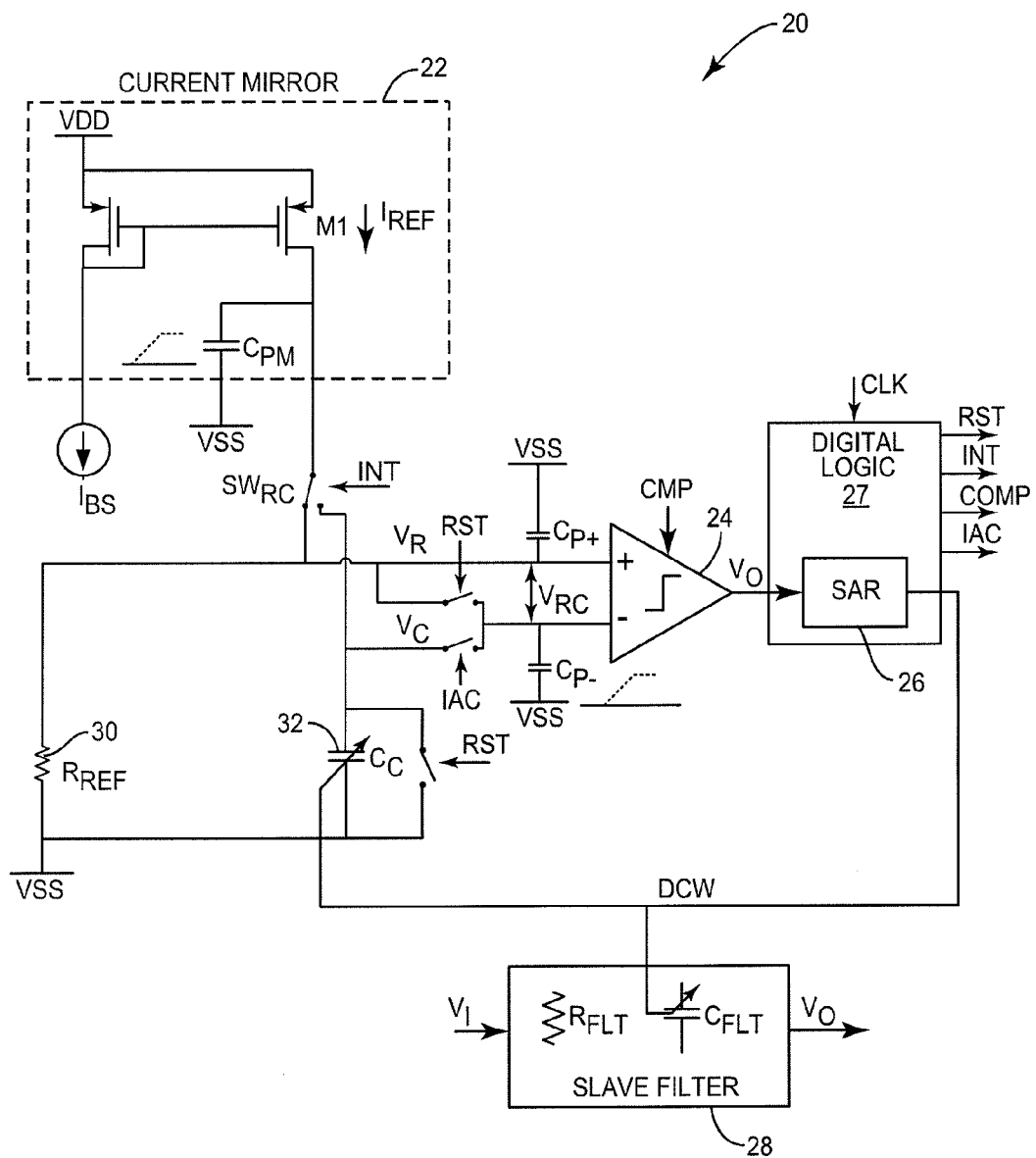
FIG. 2 is a functional schematic diagram of an RC calibration circuit according to one embodiment of the present invention.

FIG. 2 depicts a functional schematic diagram of an RC calibration circuit 20 according to one embodiment of the present invention. In this embodiment, a current steering architecture is implemented to eliminate the current sources matching requirement. Compared with traditional RC calibration circuit 10, the circuit 20 of FIG. 2 generates $V_R$ and $V_C$ from the same current source M1, so excellent current matching performance is guaranteed by the architecture.

During an initial reset phase, the RC calibration circuit 20 pre-charges the parasitic capacitance to $I_{REF}*R_{REF}$. This process will cancel out the parasitic capacitance, which eliminates the accuracy loss related to the parasitic capacitance of the current source output $C_{PM}$ and the capacitive loading from the input of comparator $C_{P-}$. This is more fully described herein.

The RC calibration circuit 20 according to one embodiment of the present invention as depicted in FIG. 2 includes: a tunable resistor 30 or tunable capacitor 32 (the capacitor 32 is depicted as the tunable element in FIG. 2); current steering switches $SW_{RC}$; a comparator 24; digital control circuitry 27 including a successive approximation register (SAR) 26; a slave filter 28, and a current mirror 22 including a single current source M1 generating one reference current $I_{REF}$.

The tuneable element 30, 32 is the device that can be tuned based on the digital control word (DCW) stored in the SAR 26. In the embodiment of FIG. 2, the capacitor $C_C$ 32 has been implemented as the tuning element.

Figure 3:
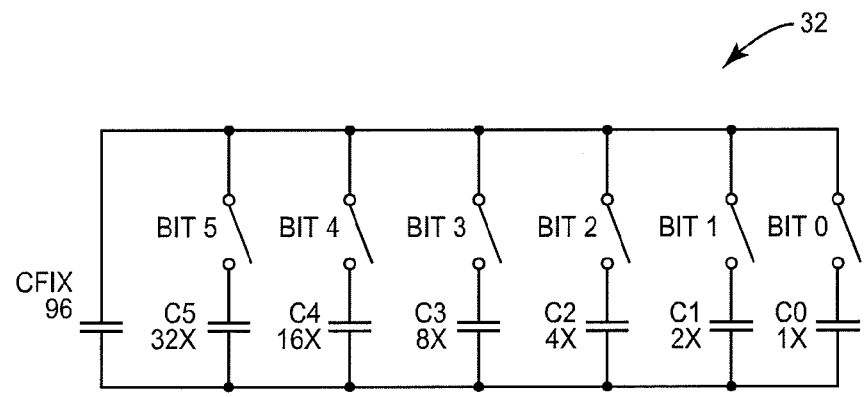
FIG. 3 is a functional schematic diagram of variable capacitor as a tuning element.

FIG. 3 depicts a representative 6-bit implementation of a variable capacitor turning element 32, using capacitors and switches. In this example, the capacitors $C_0$-$C_5$ increase in size in a binary fashion, and a capacitance is selected by applying a binary code to the bit switches. In another embodiment, the capacitor values may be equal, and a thermometer code applied to the switches. Those of skill in the art will recognize other implementations are possible.

Figure 4:
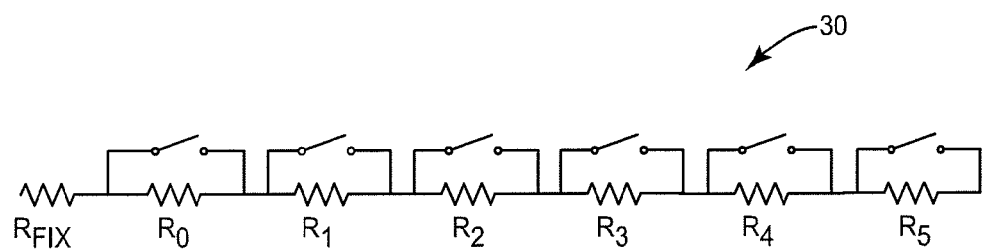
FIG. 4 is a functional schematic diagram of variable resistor as a tuning element.

The tuning element is not limited to the capacitor. For example, the resistor $R_{REF}$ 30 can be implemented as the tuning element, a representative example of which is depicted in FIG. 4. In this embodiment, resistances R_1-R_5 are selectively added in series to a fixed resistance R_FIX, by opening the associated bypass switch, and are selectively excluded from the resistance by closing the associated bypass switch. As described above, the resistances R_1-R_5 may be binary weighted and the switches controlled by a binary value, or the resistances may be equal and the switches controlled by a thermometer coded value. Those of skill in the art will recognize that a digitally-controlled, tunable resistance may be implemented in other ways.

Referring back to FIG. 2, the Single Pole Double Throw (SPDT) switch $SW_{RC}$ controls the current flow of $I_{REF}$. When INT=0 (as depicted in FIG. 2), it steers current into the resistor 30 to generate the reference voltage $V_R=I_{REF}*R_{REF}$. When INT=1, the switch $SW_{RC}$ steers the current to capacitor $C_C$ 32; the capacitor will integrate the current into voltage, and the amount of voltage change equals $$\frac{1}{C}\int I_{REF} dt \text{ where } C = C_C + C_{PM} + C_{P-}.$$

The comparator 24 compares $V_R$ and $V_C$ in response to the control signal CMP. The comparator output is set to 1, when $V_R>V_C$, and 0 when $V_R<V_C$.

A digital control circuit 27 receives a clock signal (not shown), and generates the required digital control signals to control all of the switches, as well as the status of the RC calibration circuit 20.

The SAR circuit 26 within the digital control circuit 27 starts the binary searching process by setting the MSB (most significant bit) of DCW to 1 and setting the rest of the bits of DCW to 0. The RC calibration circuit 20 generates one set of $V_R$ and $V_C$ based on the current DCW code. The comparator 24 compares $V_R$ and $V_C$. If $V_O=1$, the current RC time constant $R_{REF}*C_C$ set by the DCW code is higher than the target. This causes the SAR 26 to reset the MSB back to 0. If $V_O=0$, the SAR 26 retains the MSB setting of 1. The SAR 26 then continues the binary searching process by sequentially moving from the MSB towards the LSB of the DCW code, setting the current bit to 1, and updating that bit value based on comparator 24 output.

Figure 5:
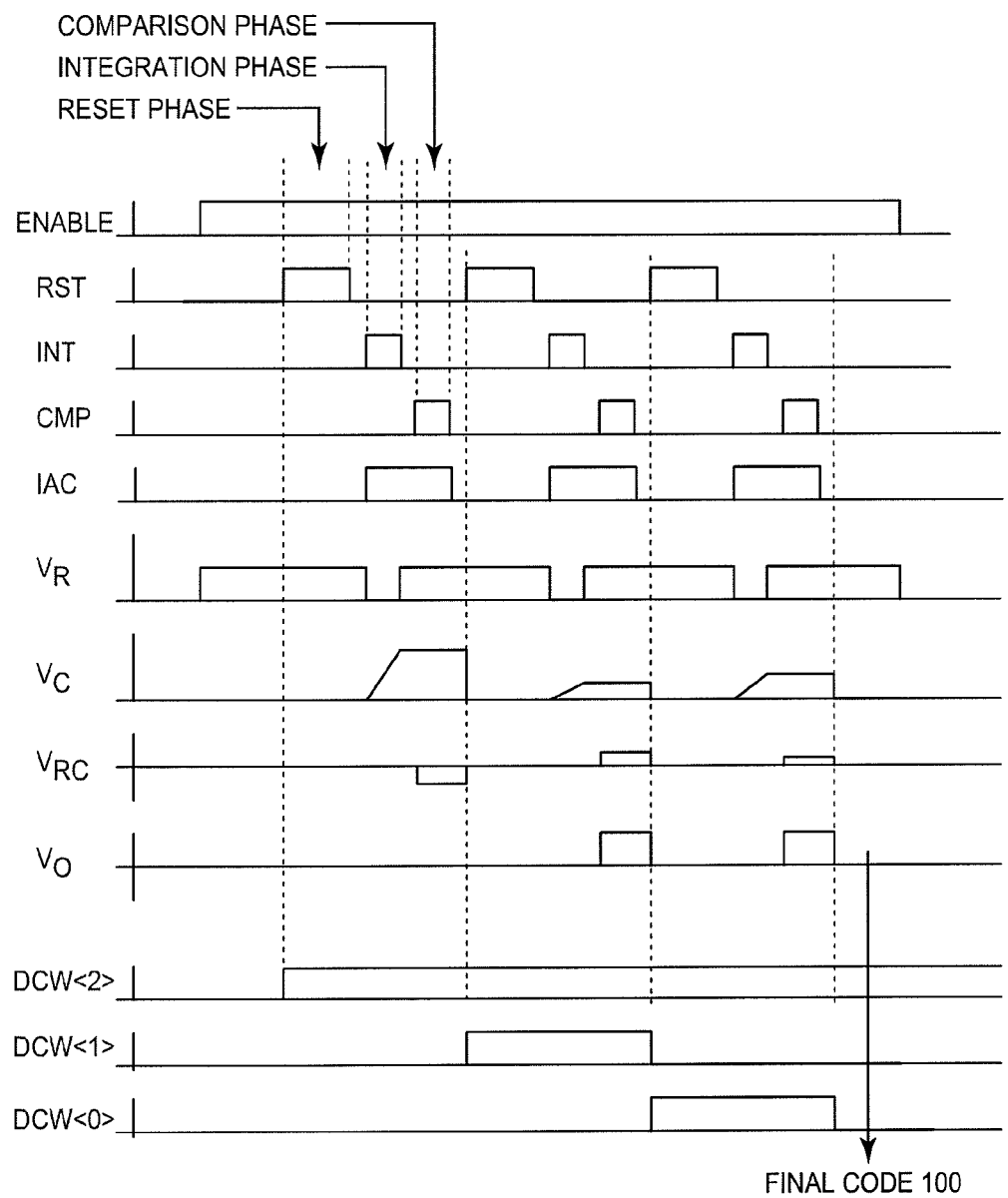
FIG. 5 is a timing diagram depicting the operation of the RC calibration circuit.

FIG. 5 is a timing diagram illustrating an example of this process for a 3-bit RC calibration circuit 20. ENABLE is a signal (not shown in FIG. 2) that enables the calibration circuit 20. RST, INT, and COMP are control signals output by the digital logic 27, as explained below. IAC is a control signal coupling the capacitor 32 output to the voltage comparator 24, and $V_R$ and $V_C$ are the voltage drops across the resistor 30 and capacitor 32, respectively. $V_{RC}$ is the voltage difference at the input to the comparator 24, and $V_O$ is the comparator 24 output voltage. The three bits of the digital control word DCW are depicted separately. Initially (beginning at the left of FIG. 5), the MSB, or DCW<2> is set to 1, and all other bits are 0.

The RC calibration circuit 20 operates in three different phases, as applied to each DCW bit calibration: reset phase, integration phase and comparison phase. These are indicated in FIG. 5 by alternate assertion of the signals (by the digital logic 27) RST, INT, and COMP, respectively.

Figure 6:
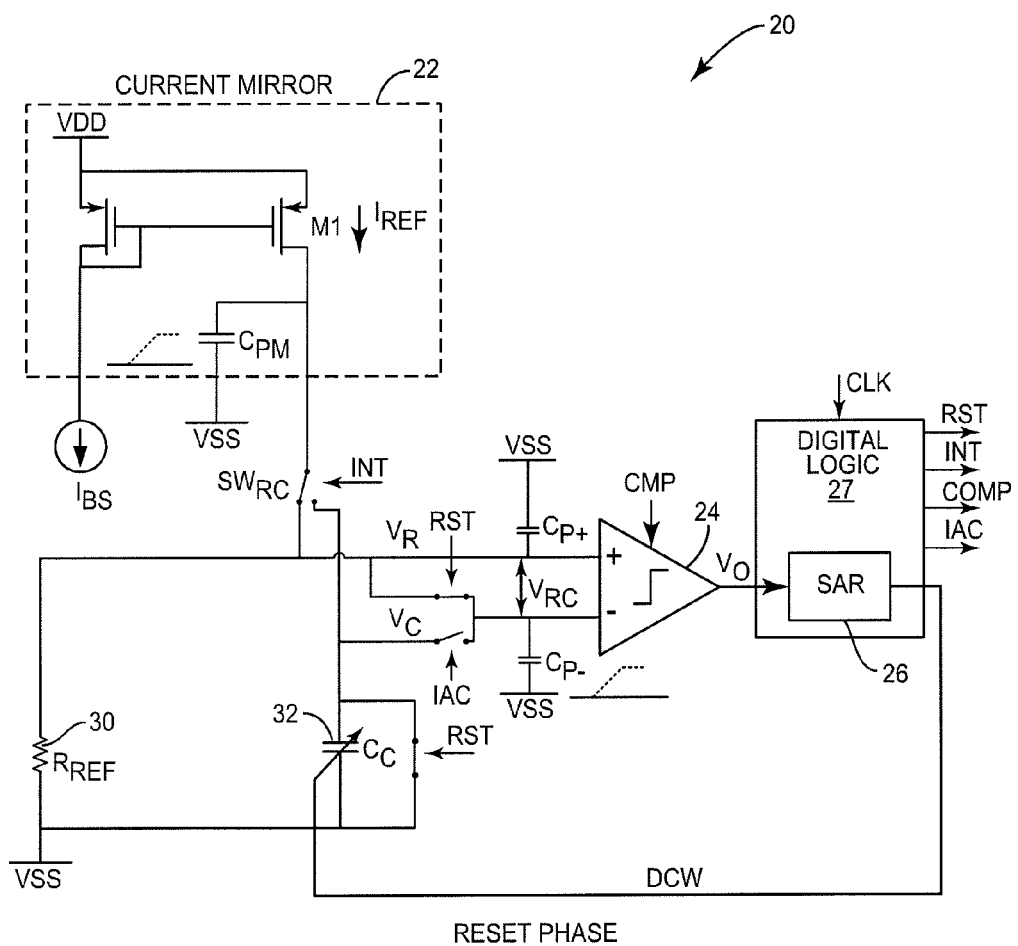
FIG. 6 is a functional schematic diagram of the RC calibration circuit in reset phase.
Figure 7:
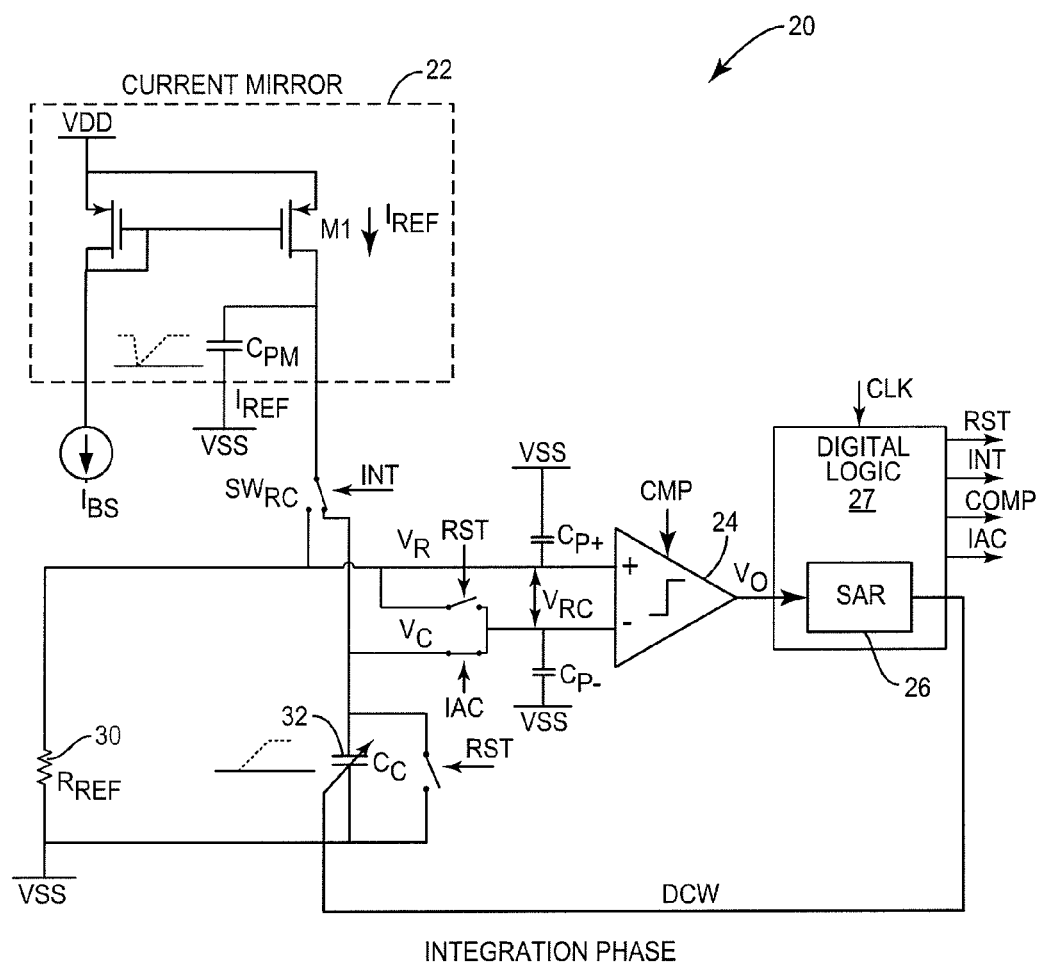
FIG. 7 is a functional schematic diagram of the RC calibration circuit in integration phase.
Figure 8:
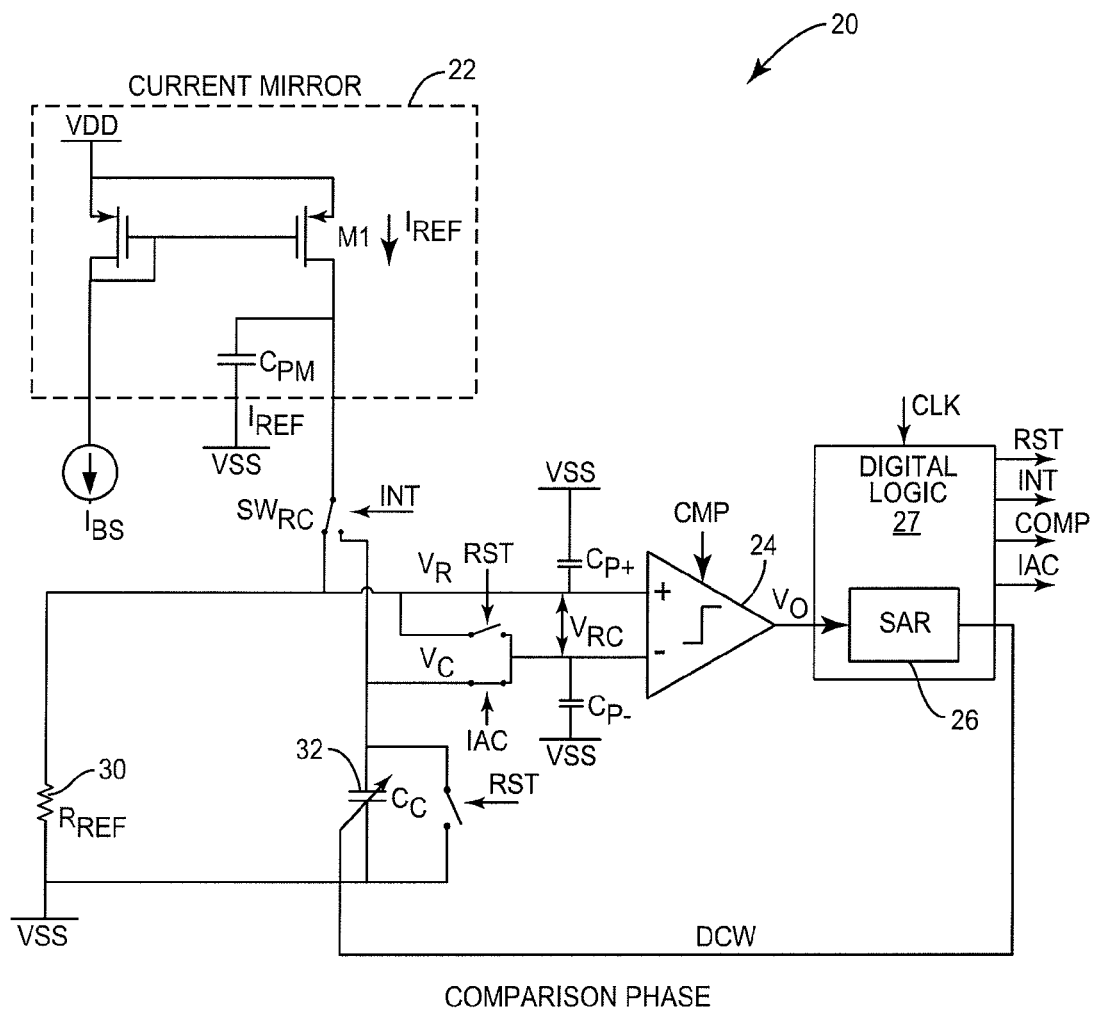
FIG. 8 is a functional schematic diagram of the RC calibration circuit in comparison phase.

FIG. 6 illustrates the circuit 20 configuration during the reset phase (FIGS. 6-8 explicate various phases of the calibration circuit 20, and omit the slave filter 28 for clarity). During the reset phase (RST=1 in FIG. 5), the current steering switch $SW_{RC}$ steers the current $I_{REF}$ into $R_{REF}$ 30. The parasitic capacitances $C_{PM}$ and $C_{P-}$ will be charged up to $I_{REF}*R_{REF}$. The tunable capacitor $C_C$ 32 is also discharged.

FIG. 7 illustrates the circuit 20 configuration during the integration phase. Integration phase follows the reset phase (INT=1 in FIG. 5). During the integration phase, the current steering switch $SW_{RC}$ steers the current $I_{REF}$ into $C_C$ 32. $C_C$ 32 integrates the current for $T_{TAR}$ seconds. At the end of the integration phase, the current steering switch $SW_{RC}$ steers current back to the resistor (i.e., INT=0). Note that, in FIG. 5, $V_R$=0, and VC is rising, while INT=1.

FIG. 8 illustrates the circuit 20 configuration during the comparison phase. Comparison phase follows the integration phase (CMP=1 in FIG. 5). During the comparison phase, the comparator 24 compares $V_R$ to $V_C$. The comparison result feeds into the SAR 26 to update the DCW code.

Referring again to FIG. 5, at the end of the reset phase, integration phase and comparison phase for the MSB of DCW<2>, $V_R$<$V_C$, and DCW<2> remains a 1. The above-described process is repeated, with the next bit, DCW<1> set to 1. At the end of the comparison phase for this bit, $V_R$>$V_C$, and DCW<1> is reset to 0. Finally, the process is repeated once again, with the LSB DCW<0> set to 1. Again, in the comparison phase, $V_R$>$V_C$, and DCW<0> is reset to 0. The final value of DCW is then 'b100. This value is "locked in" for $C_C$ 32, and is applied to the slave filter 28.

During the calibration process for each bit, since $I_{REF}$ comes from the same current source M1 in the current mirror 22, the currents used to generate $V_R$ and $V_C$ are identical, and there is no current mismatch concern.

Figure 1:
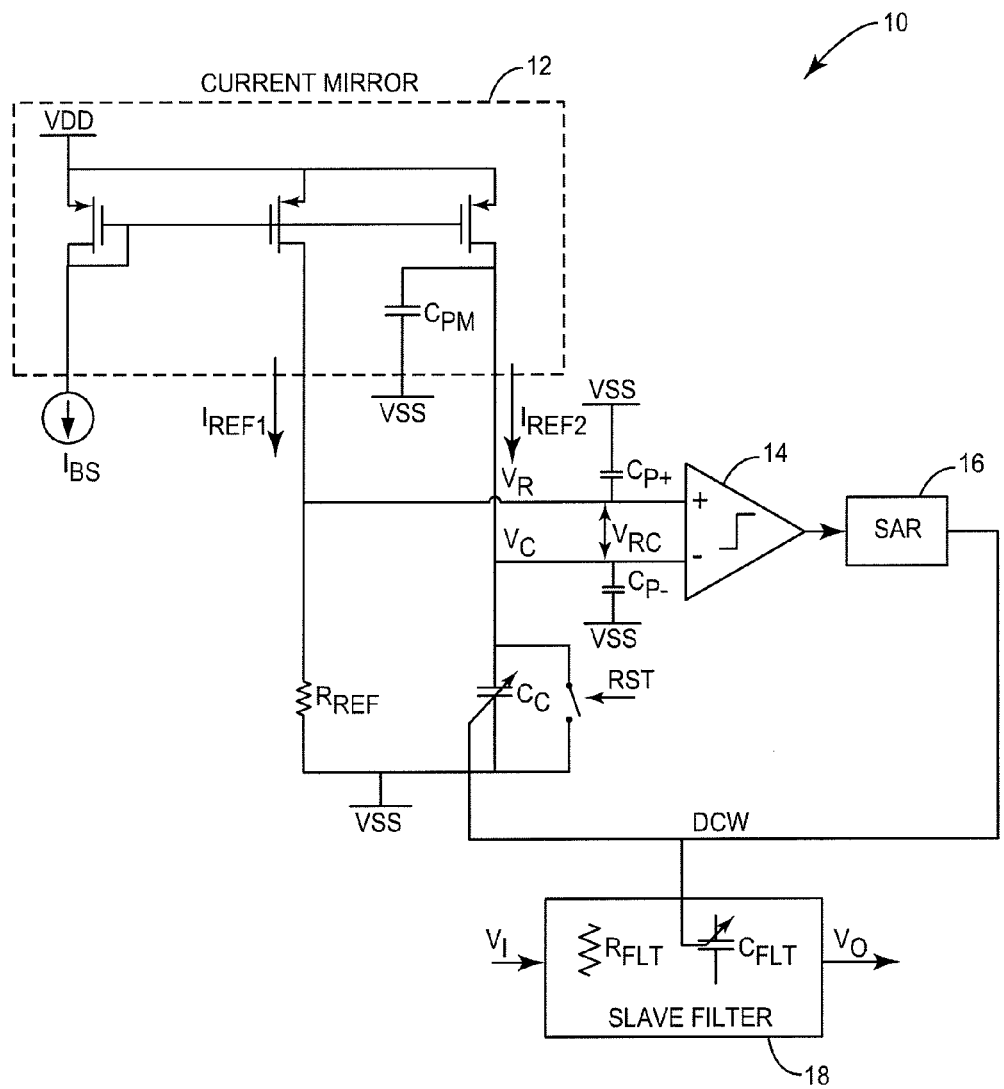
FIG. 1 is a functional schematic diagram of a prior art RC calibration circuit.

In conventional RC calibration circuits (e.g., FIG. 1), during the current integration phase, $C_C$ shares charge with $C_{P-}$, and $C_{PM}$.

The total charge $$Q_T = \int_{t=0}^{t=T_{TAR}} I_{REF} \delta t$$

sourced from current source M1 is shared by $C_C$, $C_{P-}$, and $C_{PM}$, so the actual calibrated time constant is $R_{REF}*(C_C+C_{P-}+C_{PM})$, rather than the desired time constant $R_{REF}*C_C$.

The present invention solves the parasitic capacitors ($C_{P-}$, and $C_{PM}$) charge sharing problem by pre-charging $C_{P-}$ and $C_{PM}$ to $I_{REF}*R_{REF}$ during the reset phase. Let $C_P=C_{P-}+C_{PM}$, at the end of the reset phase, the total charge accumulated on $C_P$ is $C_P*I_{REF}*R_{REF}$. This charge will be reserved to the integration phase. During the integration phase, total charge sourced from the current source is $I_{REF}*T_{TAR}$. At the end of integration cycle, $V_C$ equals to $$\frac{C_P * I_{REF} * R_{REF} + I_{REF} * T_{TAR}}{C_C + C_P}$$

The differential voltage $V_{RC}$ that feeds into the comparator 24 during the comparison cycle is $$V_{RC} = I_{REF} * R_{REF} - \frac{C_P * I_{REF} * R_{REF} + I_{REF} * T_{TAR}}{C_C + C_P} = \quad (1)$$

$$\frac{C_C}{C_C + C_P} \frac{I_{REF}}{C_C} (R_{REF} C_C - T_{TAR})$$

From equation (1), the sign of $V_{RC}$ is determined by $R_{REF}*C_C-T_{TAR}$. For a regular comparator 24, the output is determined by the sign of the differential input. At the end of the SAR binary searching process, $V_{RC}$ will be minimized close to zero, and $R_{REF}*C_C$ will be tuned to $T_{TAR}$. In equation (1), if we set $C_P$=0, it would be the $V_{RC}$ of an ideal RC calibration circuit, without parasitic capacitance. Compared with an ideal RC calibration, embodiments of the present invention, such as that depicted in FIG. 2, attenuate $V_{RC}$ by a factor of $C_C/(C_C+C_P)$. Since comparator 24 output depends on the sign of input only, these embodiments will tune the RC time constant to the same DCW code as in the ideal RC calibration circuit.

Figure 9:
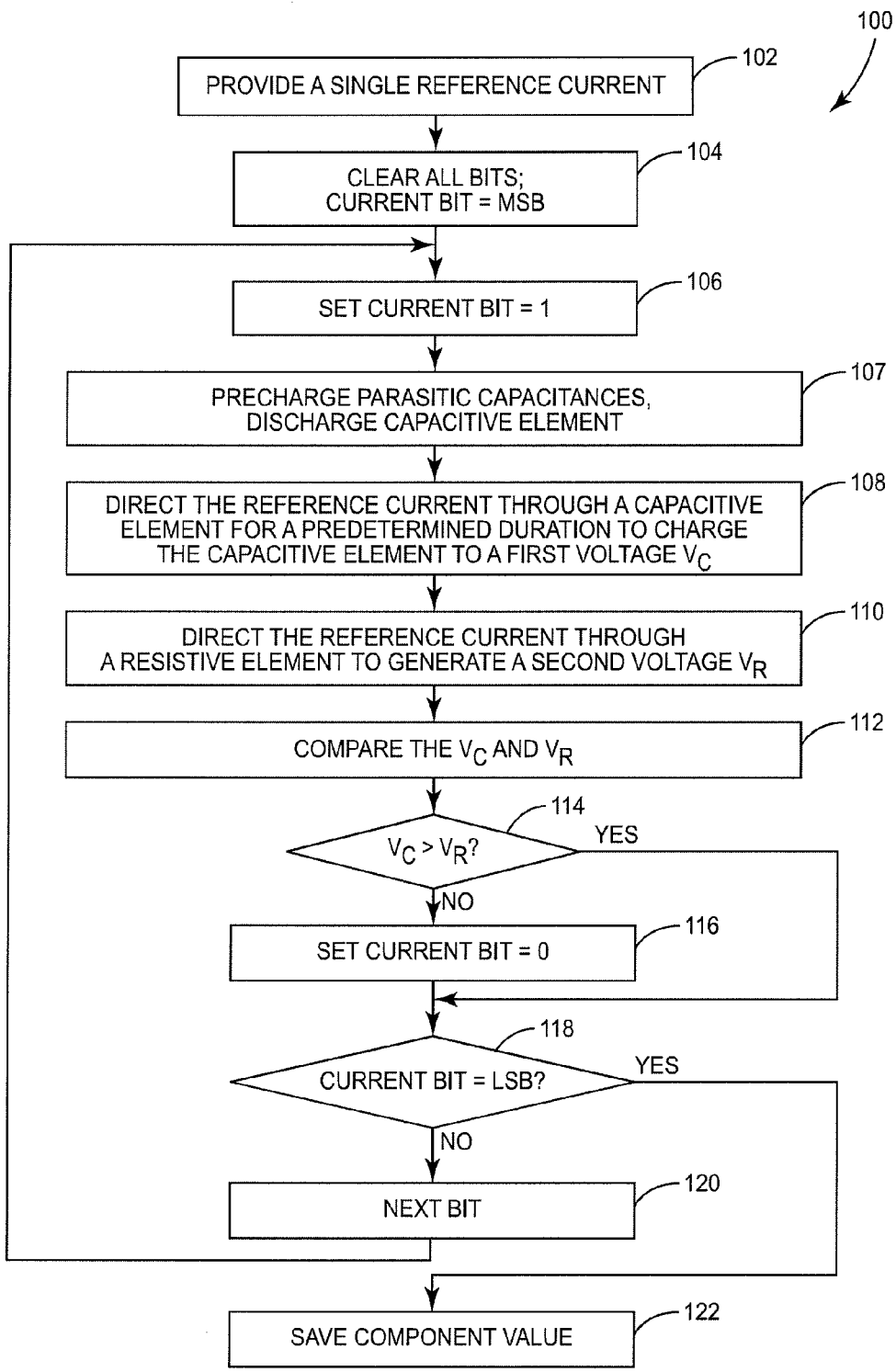
FIG. 9 is a flow diagram of a method of operating the RC calibration circuit.

FIG. 9 depicts a method 100 of calibrating an RC circuit. A single reference current $I_{REF}$ is generated (block 102). A SAR 26 clears (i.e., sets to 0) all bits in a DCW that tunes the resistance of a tunable resistive element 30 or the capacitance of a tunable capacitive element 32, and sets the current bit position to the MSB (block 106). Within a calibration loop, the SAR 26 sets the current bit value of the DCW to 1, altering the component value of the tunable resistive or capacitive element (block 106). The capacitive element is discharged, and parasitic capacitances in the RC circuit are charged to the voltage of the single reference current times the resistance of the resistive element (block 107). The reference current $I_{REF}$ is directed through the capacitive element for a predetermined duration to charge the capacitive element to a first voltage (block 108). The reference current $I_{REF}$ is then directed through the resistive element to generate a second voltage (block 110). The first and second voltages are compared, such as at the comparator 26 (block 112). If the voltage across the tunable resistive/capacitive element exceeds the voltage across the fixed resistive/capacitive element (block 114), then the DCW value for the tunable element is too high, and the current bit is set to 0 (block 116). Otherwise, the current bit remains a 1. If the current bit is not the LSB (that is, each bit in the DCW has not yet been adjusted) (block 118), the SAR 26 considers the next bit in the DCW (block 120), sets that bit to a 1 (block 106), and repeats the process. After adjusting the value all bits, and the current bit is the LSB (block 118), the full DCW code is stored, to be applied to the tunable resistive/capacitive element in the slave filter 28 (block 122).

Figure 10:
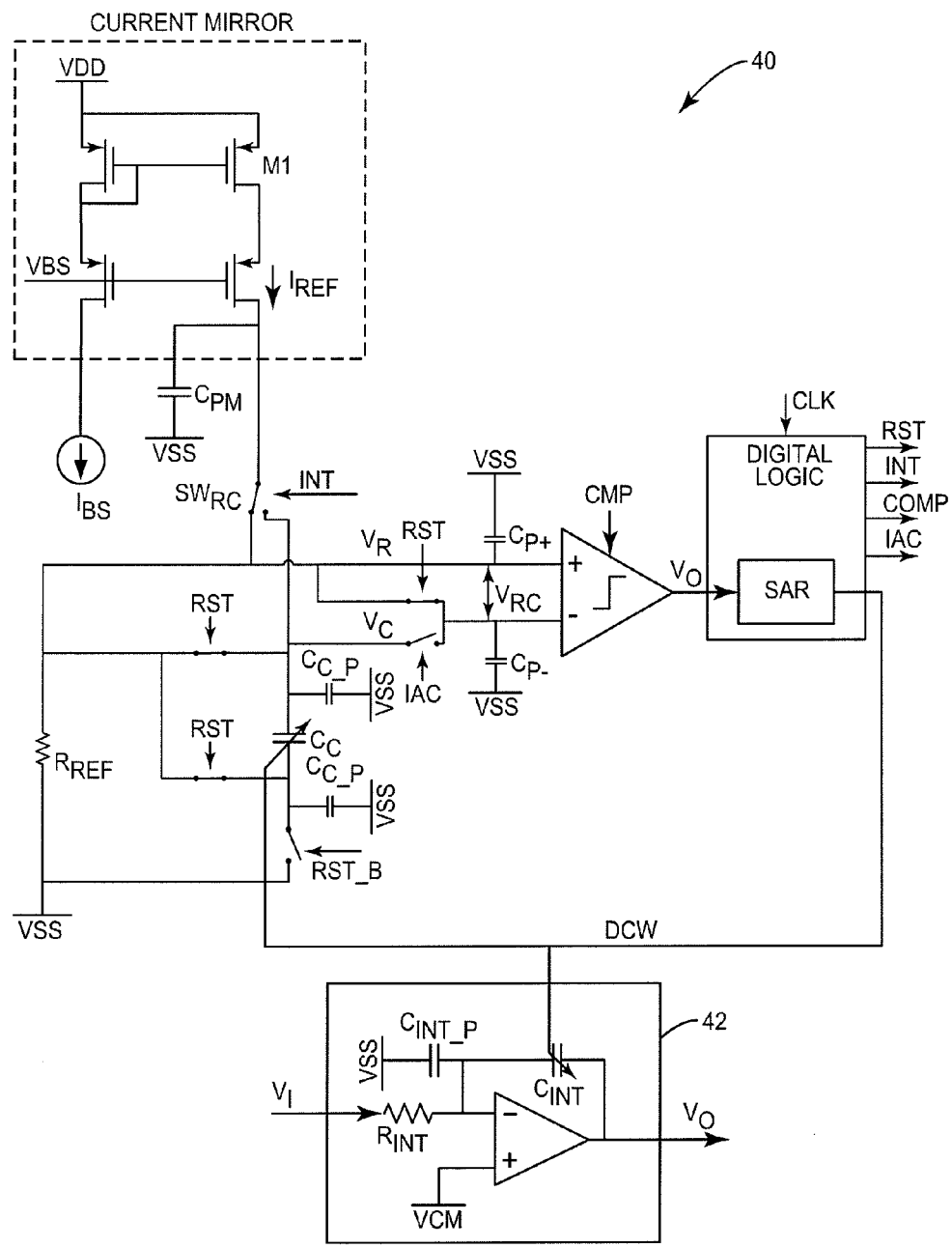
FIG. 10 is a functional schematic diagram of an RC calibration circuit according to another embodiment of the present invention.

FIG. 10 depicts an alternative embodiment 40 of the present invention that can be used to calibrate the RC time constant for a parasitic insensitive RC filter or RC integrator application. The "parasitic" in this case refers to the parasitic capacitance of the capacitor itself. For example, in the RC integrator 42 in FIG. 10, the parasitic capacitance $C_{INT\_P}$ of capacitor $C_{INT}$ is connected to the pseudo-ground of the OP amp input, so the transfer function of the integrator, $$\frac{V_O(S)}{V_I(S)} = \frac{-1}{R_{INT} \cdot C_{INT} \cdot S}$$

is insensitive to $C_{INT\_P}$. If a conventional RC calibration circuit 10 (e.g., FIG. 1) were used to maintain the integrator transfer function constant, the calibration circuit 10 would tune the RC time $R_{INT}*(C_{INT}+C_{INT\_P})$ to a target value, rather than maintaining $R_{INT}*C_{INT}$ constant. For typical sub-micron CMOS process, $C_{INT\_P}/C_{INT}$=5% to 10% range, depend on the type of capacitor, which means the conventional RC time constant calibration circuit 10 cannot be accurate below the ratio of $C_{INT\_P}/C_{INT}$. The calibration circuit 40 of FIG. 10 solves this problem by disconnecting the ground terminal of $C_C$ during the reset phase, and pre-charging parasitic capacitance $C_{C\_P}$ to $I_{REF}*R_{REF}$. The cancelling out of $C_{C\_P}$ in this embodiment is similar to the cancelling process of $C_{PM}$ and $C_{P-}$ of the embodiment 20 depicted in FIG. 2, as described above. Since the capacitors $C_C$ and $C_{INT}$ are of the same type, the ratio of $C_{INT\_P}/C_{INT}$ equals to $C_{C\_P}/C_C$. Cancelling the $C_{C\_P}$ in the RC calibration circuit is equivalent to controlling the time constant $R_{INT}*C_{INT}$ of the integrator without the influence of $C_{INT\_P}$. Accordingly, the architecture of the RC calibration circuit 40 can accurately control the time constant of $R_{INT}*C_{INT}$ and hence maintain the transfer function of the RC integrator 42 constant.

Figure 11:
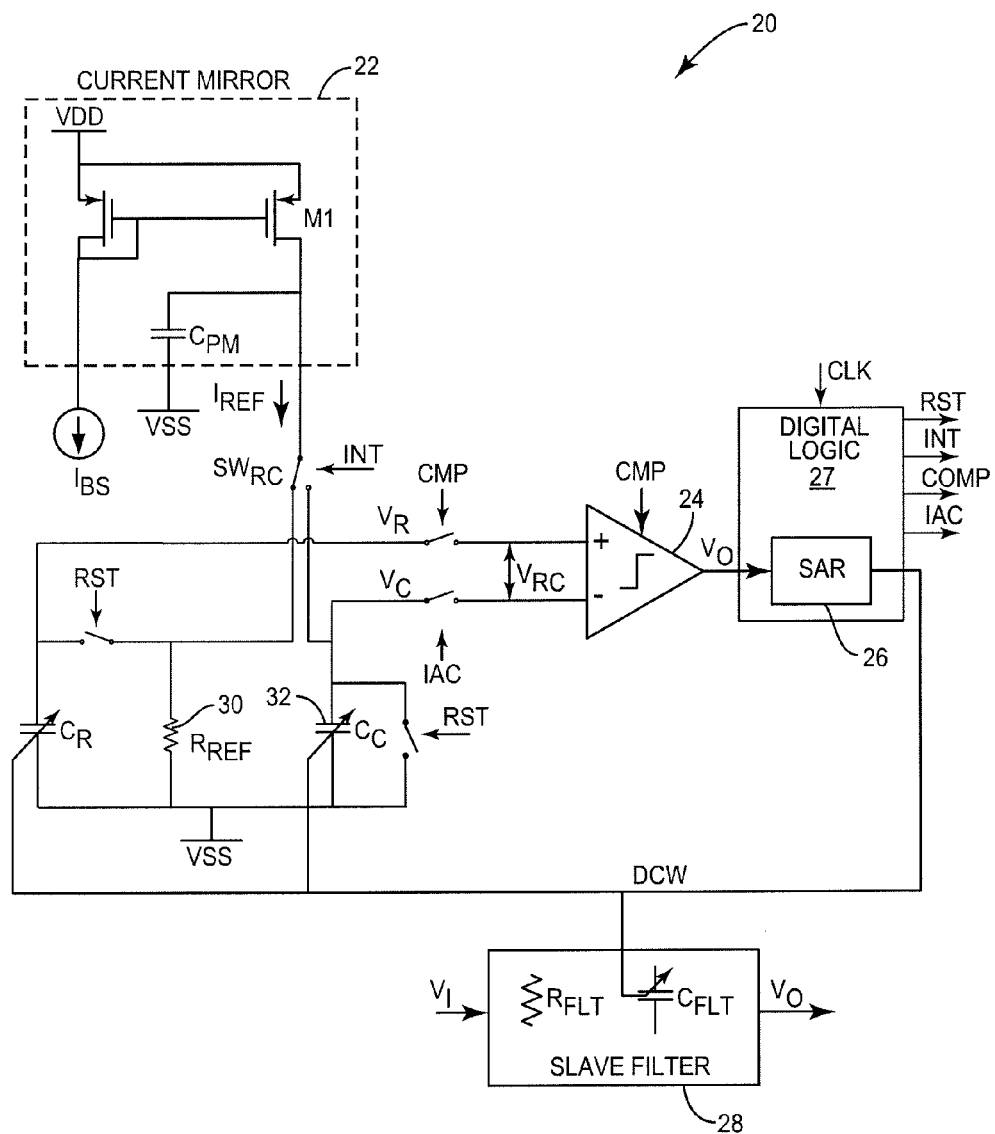
FIG. 11 is a functional schematic diagram of an RC calibration circuit according to still another embodiment of the present invention.

FIG. 11 depicts an embodiment using a tunable sampling capacitor $C_R$ to sample the voltage level $I_{REF}*R_{REF}$ during the reset phase. This reduces the noise level at the input terminals of the comparator 24 during the comparison phase.

Figure 12:
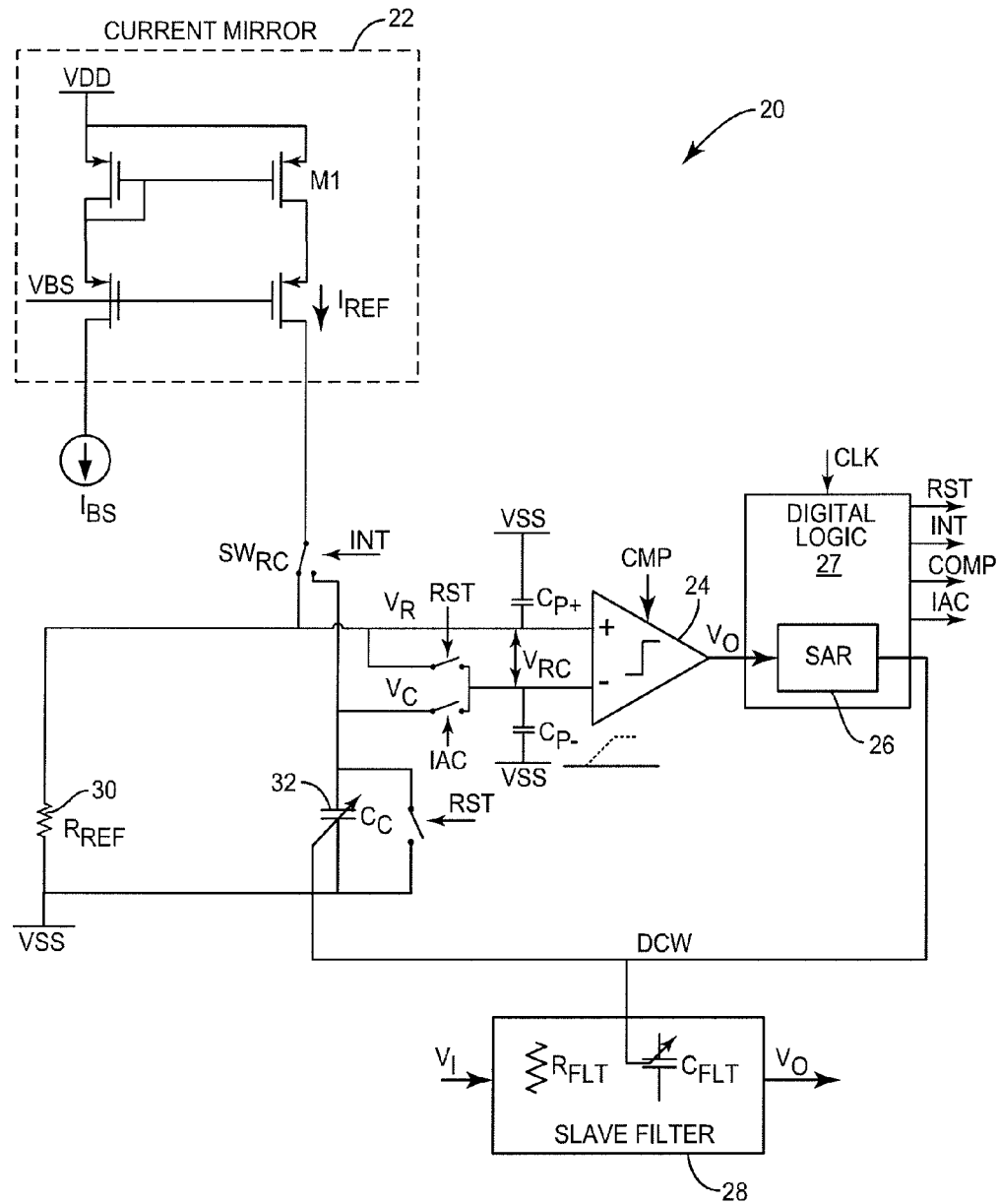
FIG. 12 is a functional schematic diagram of an RC calibration circuit according to yet another embodiment of the present invention.

FIG. 12 depicts an embodiment implementing the RC calibration circuit 20 with cascade transistors in the current mirror 22.

The RC calibration circuits 20, 40 according to embodiments of the present invention described herein present numerous advantages over the prior art. No OP amplifier is required, so the calibration accuracy is not affected by the amplifier offset and settling. No major matching component is required. Since there is only one current source used in the current steering structure, it is self-matched. The overall circuit layout size can thus be reduced. In embodiments of the present invention, parasitic capacitances are pre-charged, so they do not adversely affect calibration accuracy.

The present invention may, of course, be carried out in other ways than those specifically set forth herein without departing from essential characteristics of the invention. The present embodiments are to be considered in all respects as illustrative and not restrictive, and all changes coming within the meaning and equivalency range of the appended claims are intended to be embraced therein.

What is claimed is:

1. An RC calibration circuit, comprising:
    a resistive element;
    a capacitive element;
    wherein at least one of the resistive and capacitive elements is tunable;
    a current source providing a single reference current;
    a switching element interposed between the current source and the resistive and capacitive elements, and operative to selectively direct the single reference current through one of the resistive and capacitive elements at a time;
    a comparator operative to determine a voltage difference by comparing voltage drops across the resistive and capacitive elements; and
    a control circuit operative to control the switching element to direct the single reference current through the capacitive element for a predetermined duration to charge the capacitive element, and to subsequently direct the single reference current through the resistive element, and further operative to tune at least one of the resistive and capacitive elements so as to minimize the voltage difference determined by the comparator.

2. The circuit of claim 1 wherein the control circuit includes at least one digital logic circuit.

3. The circuit of claim 2 wherein the control circuit includes a successive approximation register operative to store a digital control word that controls a variable component value of the tunable resistive or capacitive element.

4. The circuit of claim 3 wherein the control circuit performs a calibration process comprising a binary search, using the digital control word, to tune the component value of the tunable resistive or capacitive element.

5. The circuit of claim 4 wherein, after the calibration process, the digital control word is supplied to a corresponding tunable resistive or capacitive element in an associated circuit.

6. The circuit of claim 4 wherein the digital control word comprises an N-bit digital word, and wherein the binary search of the calibration process comprises:
    initially setting at least (N−1) least significant bits to a first binary value;
    setting a first bit to a second binary value and comparing the resulting voltage drops across the resistive and capacitive elements;
    retaining or resetting the value of the first bit in response to the comparison; and
    repeating the process for each successive, remaining bit.

7. The circuit of claim 6 wherein the first bit is the most significant bit, and wherein repeating the process comprises repeating the process for each successive bit from the most to the least significant bit.

8. The circuit of claim 6 wherein, for each bit, the calibration process comprises:
    a reset phase in which the reference current flows through the resistive element, the capacitive element is discharged, and parasitic capacitances in the circuit are charged to the voltage drop across the resistive element;
    an integration phase during which the reference current flows through the capacitive element for a predetermined duration; and
    a comparison phase during which the reference current again flows through the resistive element, and during which the voltage drops across the resistive and capacitive elements are compared.

9. The circuit of claim 8 wherein, during the reset phase, after the capacitive element is discharged, both terminals of the capacitive element are set to the voltage drop across the resistive element, so as to charge parasitic capacitances of the capacitive element itself.

10. The circuit of claim 9 wherein, after the calibration process, the digital control word is supplied to a corresponding tunable resistive or capacitive element in an associated RC integrator circuit.

11. The circuit of claim 8 further comprising a sampling capacitor in parallel with the resistive element and operative to charge to the voltage drop across the resistive element during the reset phase.

12. The circuit of claim 1 wherein the current source comprises cascaded transistors.

13. A method of tuning a variable component value of one of a resistive and capacitive element in an RC calibration circuit so as to equalize the voltage drops across the resistive and capacitive elements, comprising:
    providing a single reference current and a switching element operative to direct the single reference current to flow alternatively through the resistive or capacitive element;
    directing the reference current through the capacitive element for a predetermined duration to charge the capacitive element to a first voltage;
    directing the reference current through the resistive element to generate a second voltage;
    comparing the first and second voltages;
    altering the variable component value of one of the resistive and capacitive elements in response to the comparison; and
    repeating the process with different component values until the first and second voltages are substantially equal.

14. The method of claim 13 further comprising:
    prior to comparing the first and second voltages, charging parasitic capacitances in the circuit to the second voltage.

15. The method of claim 14 wherein comparing the first and second voltages comprises inputting the first and second voltages to a comparator, and wherein the parasitic capacitances are associated with the comparator inputs.

16. The method of claim 15 wherein the parasitic capacitances are further associated with the current source.

17. The method of claim 14 wherein the parasitic capacitances are associated with the capacitive element itself.

18. The method of claim 13 wherein repeating the process with different component values comprises:
   initially setting (N−1) least significant bits of an N-bit control word to zero, the control word operative to tune a variable component value of the resistive or capacitive element;
   setting the most significant bit of the control word to one and performing the voltage comparison;
   retaining or resetting the value of the most significant bit in response to the comparison; and
   repeating the process for each successive, remaining bit.

19. The method of claim 18 wherein, for each bit, the voltage comparison comprises:
   a reset phase in which the reference current flows through the resistive element, the capacitive element is discharged, and parasitic capacitances in the circuit are charged to the voltage drop across the resistive element;
   an integration phase during which the reference current flows through the capacitive element for a predetermined duration; and
   a comparison phase during which the reference current again flows through the resistive element, and during which the voltage drops across the resistive and capacitive elements are compared.

* * * * *